(12) United States Patent
Dubucq et al.

(10) Patent No.: US 10,241,677 B2
(45) Date of Patent: Mar. 26, 2019

(54) ENSURING CONSISTENCY BETWEEN CONTENT AND METADATA WITH INTENTS

(71) Applicant: International Business Machines Corporation, Armonk, NY (US)

(72) Inventors: Thomas Dubucq, Chicago, IL (US); Jeremy S. Jarczyk, Lombard, IL (US); Ravi V. Khadiwala, Bartlett, IL (US); Manish Motwani, Chicago, IL (US); Renars W. Narubin, Chicago, IL (US); Jason K. Resch, Chicago, IL (US); Daniel J. Scholl, Chicago, IL (US); Yogesh R. Vedpathak, Chicago, IL (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/442,240

(22) Filed: Feb. 24, 2017

(65) Prior Publication Data

US 2018/0246644 A1 Aug. 30, 2018

(51) Int. Cl.
*G06F 3/06* (2006.01)
*G06F 11/10* (2006.01)
(Continued)

(52) U.S. Cl.
CPC ............ *G06F 3/0604* (2013.01); *G06F 3/064* (2013.01); *G06F 3/067* (2013.01); *G06F 3/0619* (2013.01);
(Continued)

(58) Field of Classification Search
CPC ...... G06F 3/0604; G06F 3/0619; G06F 3/064; G06F 3/0659; G06F 3/067; G06F 17/30;
(Continued)

(56) References Cited

U.S. PATENT DOCUMENTS 4,092,732 A 5/1978 Ouchi
5,454,101 A 9/1995 Mackay et al.
(Continued)

OTHER PUBLICATIONS

Shamir; How to Share a Secret; Communications of the ACM; vol. 22, No. 11; Nov. 1979; pp. 612-613.
(Continued)

*Primary Examiner* — Shelly A Chase
(74) *Attorney, Agent, or Firm* — Garlick & Markison; Timothy W. Markison; Shayne X. Short

(57) ABSTRACT

A storage unit (SU) includes an interface configured to interface and communicate with a dispersed storage network (DSN), a memory that stores operational instructions, and a processing module operably coupled to the interface and memory such that the processing module, when operable within the SU based on the operational instructions, is configured to perform various operations. The SU stores at least one encoded data slice (EDS) of first EDSs corresponding to a data object that are distributedly stored in first SUs and also an intent message that includes specifications for consistency between the data object and metadata of the data object. A second set of EDSs corresponding to the metadata are distributedly stored in second SUs. The SU services the intent message to determine consistency of the data object and the metadata based on the specifications and deletes the intent message when they are consistent.

20 Claims, 12 Drawing Sheets

(51) Int. Cl.
*G06F 17/30* (2006.01)
*H03M 13/15* (2006.01)
*H03M 13/00* (2006.01)

(52) U.S. Cl.
CPC ........ *G06F 3/0659* (2013.01); *G06F 11/1076* (2013.01); *G06F 17/30371* (2013.01); *H03M 13/1515* (2013.01); *H03M 13/616* (2013.01)

(58) Field of Classification Search
CPC ........ G06F 17/30067; G06F 17/30371; G06F 11/1076
See application file for complete search history.

(56) References Cited

U.S. PATENT DOCUMENTS

| | | | |
|---|---|---|---|
| 5,485,474 A | 1/1996 | Rabin | |
| 5,774,643 A | 6/1998 | Lubbers et al. | |
| 5,802,364 A | 9/1998 | Senator et al. | |
| 5,809,285 A | 9/1998 | Hilland | |
| 5,890,156 A | 3/1999 | Rekieta et al. | |
| 5,987,622 A | 11/1999 | Lo Verso et al. | |
| 5,991,414 A | 11/1999 | Garay et al. | |
| 6,012,159 A | 1/2000 | Fischer et al. | |
| 6,058,454 A | 5/2000 | Gerlach et al. | |
| 6,128,277 A | 10/2000 | Bruck et al. | |
| 6,175,571 B1 | 1/2001 | Haddock et al. | |
| 6,192,472 B1 | 2/2001 | Garay et al. | |
| 6,256,688 B1 | 7/2001 | Suetaka et al. | |
| 6,272,658 B1 | 8/2001 | Steele et al. | |
| 6,301,604 B1 | 10/2001 | Nojima | |
| 6,356,949 B1 | 3/2002 | Katsandres et al. | |
| 6,366,995 B1 | 4/2002 | Vilkov et al. | |
| 6,374,336 B1 | 4/2002 | Peters et al. | |
| 6,415,373 B1 | 7/2002 | Peters et al. | |
| 6,418,539 B1 | 7/2002 | Walker | |
| 6,449,688 B1 | 9/2002 | Peters et al. | |
| 6,567,948 B2 | 5/2003 | Steele et al. | |
| 6,571,282 B1 | 5/2003 | Bowman-Amuah | |
| 6,609,223 B1 | 8/2003 | Wolfgang | |
| 6,718,361 B1 | 4/2004 | Basani et al. | |
| 6,760,808 B2 | 7/2004 | Peters et al. | |
| 6,785,768 B2 | 8/2004 | Peters et al. | |
| 6,785,783 B2 | 8/2004 | Buckland | |
| 6,826,711 B2 | 11/2004 | Moulton et al. | |
| 6,879,596 B1 | 4/2005 | Dooply | |
| 7,003,688 B1 | 2/2006 | Pittelkow et al. | |
| 7,024,451 B2 | 4/2006 | Jorgenson | |
| 7,024,609 B2 | 4/2006 | Wolfgang et al. | |
| 7,080,101 B1 | 7/2006 | Watson et al. | |
| 7,103,824 B2 | 9/2006 | Halford | |
| 7,103,915 B2 | 9/2006 | Redlich et al. | |
| 7,111,115 B2 | 9/2006 | Peters et al. | |
| 7,140,044 B2 | 11/2006 | Redlich et al. | |
| 7,146,644 B2 | 12/2006 | Redlich et al. | |
| 7,171,493 B2 | 1/2007 | Shu et al. | |
| 7,222,133 B1 | 5/2007 | Raipurkar et al. | |
| 7,240,236 B2 | 7/2007 | Cutts et al. | |
| 7,272,613 B2 | 9/2007 | Sim et al. | |
| 7,636,724 B2 | 12/2009 | de la Torre et al. | |
| 8,046,548 B1* | 10/2011 | Chatterjee | G06F 11/2064 707/655 |
| 8,386,840 B2* | 2/2013 | Stougie | G06F 11/1076 714/6.2 |
| 8,448,153 B1* | 5/2013 | Wang | G06F 8/437 717/146 |
| 2002/0062422 A1 | 5/2002 | Butterworth et al. | |
| 2002/0166079 A1 | 11/2002 | Ulrich et al. | |
| 2003/0018927 A1 | 1/2003 | Gadir et al. | |
| 2003/0037261 A1 | 2/2003 | Meffert et al. | |
| 2003/0065617 A1 | 4/2003 | Watkins et al. | |
| 2003/0084020 A1 | 5/2003 | Shu | |
| 2004/0024963 A1 | 2/2004 | Talagala et al. | |
| 2004/0122917 A1 | 6/2004 | Menon et al. | |
| 2004/0215998 A1 | 10/2004 | Buxton et al. | |
| 2004/0228493 A1 | 11/2004 | Ma et al. | |
| 2005/0100022 A1 | 5/2005 | Ramprashad | |
| 2005/0114594 A1 | 5/2005 | Corbett et al. | |
| 2005/0125593 A1 | 6/2005 | Karpoff et al. | |
| 2005/0131993 A1 | 6/2005 | Fatula, Jr. | |
| 2005/0132070 A1 | 6/2005 | Redlich et al. | |
| 2005/0144382 A1 | 6/2005 | Schmisseur | |
| 2005/0229069 A1 | 10/2005 | Hassner | |
| 2006/0047907 A1 | 3/2006 | Shiga et al. | |
| 2006/0136448 A1 | 6/2006 | Cialini et al. | |
| 2006/0156059 A1 | 7/2006 | Kitamura | |
| 2006/0224603 A1 | 10/2006 | Correll, Jr. | |
| 2007/0079081 A1 | 4/2007 | Gladwin et al. | |
| 2007/0079082 A1 | 4/2007 | Gladwin et al. | |
| 2007/0079083 A1 | 4/2007 | Gladwin et al. | |
| 2007/0088970 A1 | 4/2007 | Buxton et al. | |
| 2007/0174192 A1 | 7/2007 | Gladwin et al. | |
| 2007/0214285 A1 | 9/2007 | Au et al. | |
| 2007/0234110 A1 | 10/2007 | Soran et al. | |
| 2007/0283167 A1 | 12/2007 | Venters, III et al. | |
| 2009/0094251 A1 | 4/2009 | Gladwin et al. | |
| 2009/0094318 A1 | 4/2009 | Gladwin et al. | |
| 2010/0023524 A1 | 1/2010 | Gladwin et al. | |
| 2011/0055170 A1* | 3/2011 | Mark | G06F 17/30067 707/691 |
| 2013/0283095 A1* | 10/2013 | Dhuse | G06F 11/1076 714/6.22 |

OTHER PUBLICATIONS

Rabin; Efficient Dispersal of Information for Security, Load Balancing, and Fault Tolerance; Journal of the Association for Computer Machinery; vol. 36, No. 2; Apr. 1989; pp. 335-348.

Chung; An Automatic Data Segmentation Method for 3D Measured Data Points; National Taiwan University; pp. 1-8; 1998.

Plank, T1: Erasure Codes for Storage Applications; FAST2005, 4th Usenix Conference on File Storage Technologies; Dec. 13-16, 2005; pp. 1-74.

Wildi; Java iSCSi Initiator; Master Thesis; Department of Computer and Information Science, University of Konstanz; Feb. 2007; 60 pgs.

Legg; Lightweight Directory Access Protocol (LDAP): Syntaxes and Matching Rules; IETF Network Working Group; RFC 4517; Jun. 2006; pp. 1-50.

Zeilenga; Lightweight Directory Access Protocol (LDAP): Internationalized String Preparation; IETF Network Working Group; RFC 4518; Jun. 2006; pp. 1-14.

Smith; Lightweight Directory Access Protocol (LDAP): Uniform Resource Locator; IETF Network Working Group; RFC 4516; Jun. 2006; pp. 1-15.

Smith; Lightweight Directory Access Protocol (LDAP): String Representation of Search Filters; IETF Network Working Group; RFC 4515; Jun. 2006; pp. 1-12.

Zeilenga; Lightweight Directory Access Protocol (LDAP): Directory Information Models; IETF Network Working Group; RFC 4512; Jun. 2006; pp. 1-49.

Sciberras; Lightweight Directory Access Protocol (LDAP): Schema for User Applications; IETF Network Working Group; RFC 4519; Jun. 2006; pp. 1-33.

Harrison; Lightweight Directory Access Protocol (LDAP): Authentication Methods and Security Mechanisms; IETF Network Working Group; RFC 4513; Jun. 2006; pp. 1-32.

Zeilenga; Lightweight Directory Access Protocol (LDAP): Technical Specification Road Map; IETF Network Working Group; RFC 4510; Jun. 2006; pp. 1-8.

Zeilenga; Lightweight Directory Access Protocol (LDAP): String Representation of Distinguished Names; IETF Network Working Group; RFC 4514; Jun. 2006; pp. 1-15.

Sermersheim; Lightweight Directory Access Protocol (LDAP): The Protocol; IETF Network Working Group; RFC 4511; Jun. 2006; pp. 1-68.

Satran, et al.; Internet Small Computer Systems Interface (iSCSI); IETF Network Working Group; RFC 3720; Apr. 2004; pp. 1-257.

(56) References Cited

OTHER PUBLICATIONS

Xin, et al.; Evaluation of Distributed Recovery in Large-Scale Storage Systems; 13th IEEE International Symposium on High Performance Distributed Computing; Jun. 2004; pp. 172-181.
Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

\* cited by examiner

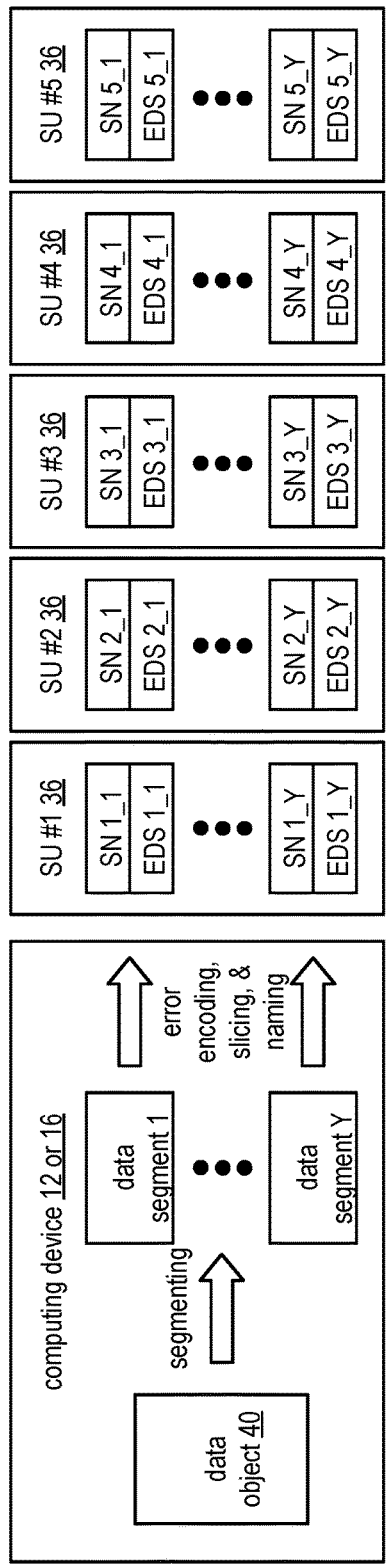
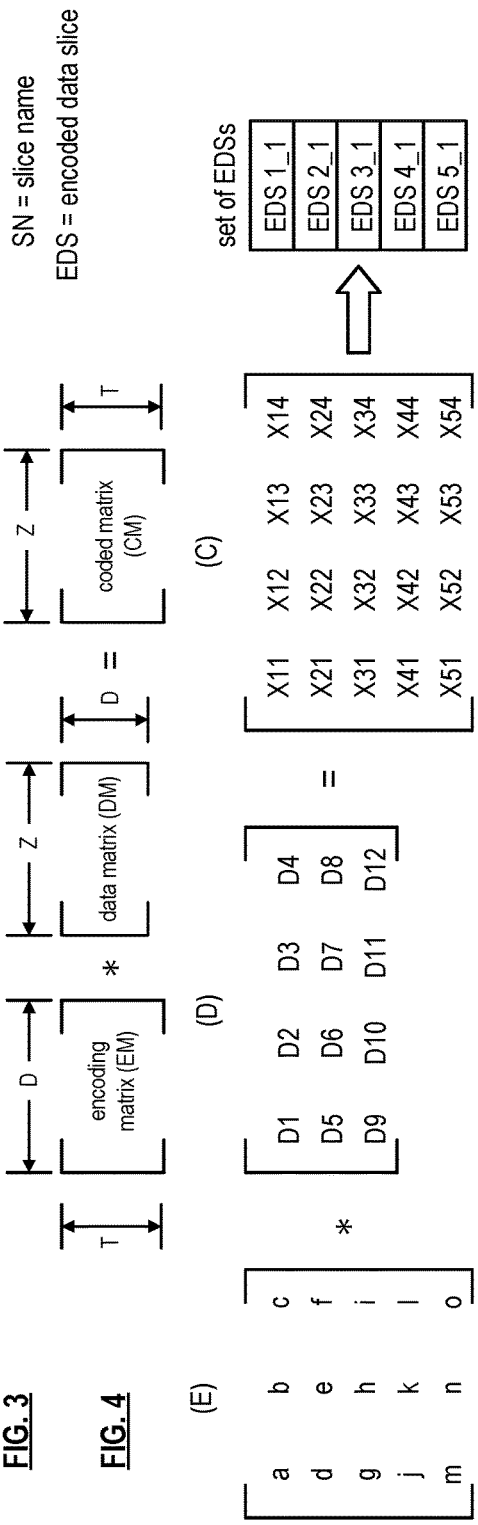
FIG. 3
FIG. 4
FIG. 5
FIG. 6

ENSURING CONSISTENCY BETWEEN CONTENT AND METADATA WITH INTENTS

STATEMENT REGARDING FEDERALLY SPONSORED RESEARCH OR DEVELOPMENT

Not applicable.

INCORPORATION-BY-REFERENCE OF MATERIAL SUBMITTED ON A COMPACT DISC

Not applicable

BACKGROUND OF THE INVENTION

Technical Field of the Invention

This invention relates generally to computer networks and more particularly to dispersing error encoded data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

Within certain data storage systems, there can be different types of data that have certain relationships. With respect to such data having such relationships, when one portion of data is updated, there may be situations when other related data fails to get updated appropriately. Prior art data storage systems do not provide adequate means to maintain consistency between such different types of data that have such relationships.

BRIEF DESCRIPTION OF THE SEVERAL VIEWS OF THE DRAWING(S)

FIG. 3 is a schematic block diagram of an example of dispersed storage error encoding of data in accordance with the present invention;

FIG. 4 is a schematic block diagram of a generic example of an error encoding function in accordance with the present invention;

FIG. 5 is a schematic block diagram of a specific example of an error encoding function in accordance with the present invention;

FIG. 6 is a schematic block diagram of an example of a slice name of an encoded data slice (EDS) in accordance with the present invention;

DETAILED DESCRIPTION OF THE INVENTION

Figure 1:
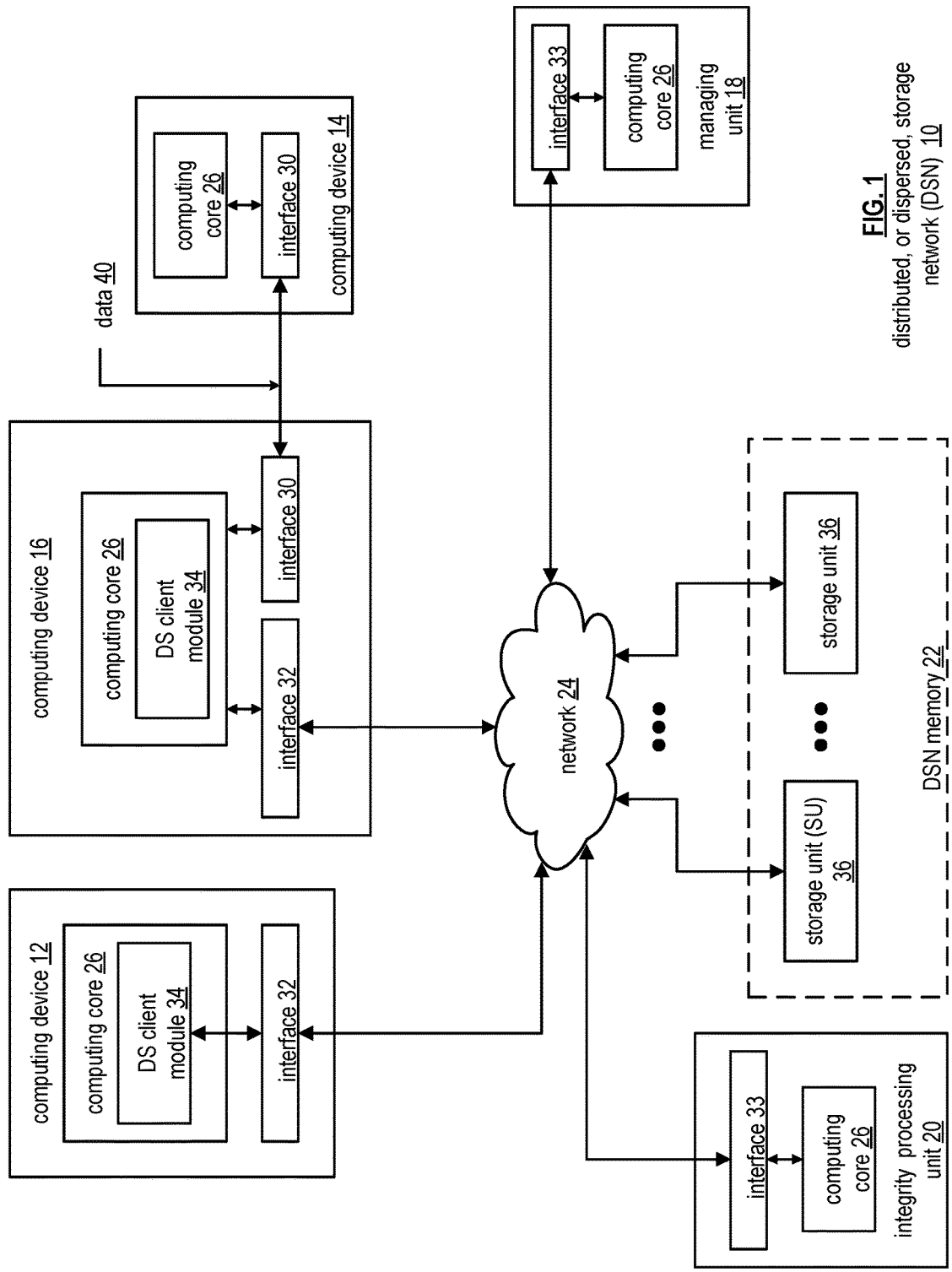
FIG. 1 is a schematic block diagram of an embodiment of a dispersed or distributed storage network (DSN) in accordance with the present invention.

FIG. 1 is a schematic block diagram of an embodiment of a dispersed, or distributed, storage network (DSN) 10 that includes a plurality of computing devices 12-16, a managing unit 18, an integrity processing unit 20, and a DSN memory 22. The components of the DSN 10 are coupled to a network 24, which may include one or more wireless and/or wire lined communication systems; one or more non-public intranet systems and/or public internet systems; and/or one or more local area networks (LAN) and/or wide area networks (WAN).

Figure 2:
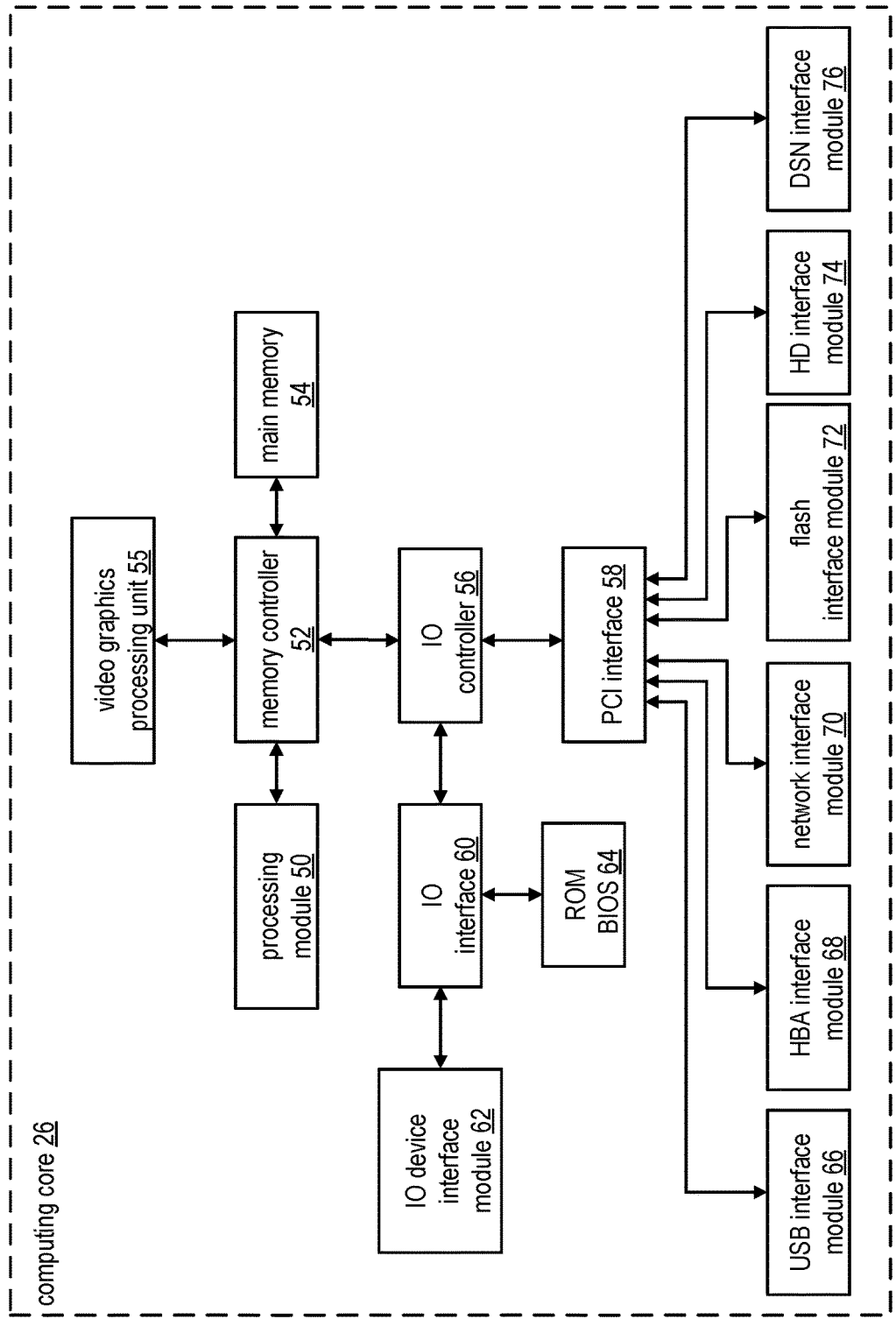
FIG. 2 is a schematic block diagram of an embodiment of a computing core in accordance with the present invention.

The DSN memory 22 includes a plurality of storage units 36 that may be located at geographically different sites (e.g., one in Chicago, one in Milwaukee, etc.), at a common site, or a combination thereof. For example, if the DSN memory 22 includes eight storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units 36. Further note that each storage unit 36 includes a computing core (as shown in FIG. 2, or components thereof) and a plurality of memory devices for storing dispersed error encoded data.

Each of the computing devices 12-16, the managing unit 18, and the integrity processing unit 20 include a computing core 26, which includes network interfaces 30-33. Computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each of the managing unit 18 and the integrity processing unit 20 may be separate computing devices, may be a common computing device, and/or may be integrated into one or more of the computing devices 12-16 and/or into one or more of the storage units 36.

Each interface 30, 32, and 33 includes software and hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 & 16 and the DSN memory 22. As yet another example, interface 33 supports a communication link for each of the managing unit 18 and the integrity processing unit 20 to the network 24.

Computing devices 12 and 16 include a dispersed storage (DS) client module 34, which enables the computing device to dispersed storage error encode and decode data as subsequently described with reference to one or more of FIGS. 3-8. In this example embodiment, computing device 16 functions as a dispersed storage processing agent for computing device 14. In this role, computing device 16 dispersed storage error encodes and decodes data on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing the data).

In operation, the managing unit 18 performs DS management services. For example, the managing unit 18 establishes distributed data storage parameters (e.g., vault creation, distributed storage parameters, security parameters, billing information, user profile information, etc.) for computing devices 12-14 individually or as part of a group of user devices. As a specific example, the managing unit 18 coordinates creation of a vault (e.g., a virtual memory block associated with a portion of an overall namespace of the DSN) within the DSN memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20.

The DSN managing unit 18 creates and stores user profile information (e.g., an access control list (ACL)) in local memory and/or within memory of the DSN module 22. The user profile information includes authentication information, permissions, and/or the security parameters. The security parameters may include encryption/decryption scheme, one or more encryption keys, key generation scheme, and/or data encoding/decoding scheme.

The DSN managing unit 18 creates billing information for a particular user, a user group, a vault access, public vault access, etc. For instance, the DSN managing unit 18 tracks the number of times a user accesses a non-public vault and/or public vaults, which can be used to generate a per-access billing information. In another instance, the DSN managing unit 18 tracks the amount of data stored and/or retrieved by a user device and/or a user group, which can be used to generate a per-data-amount billing information.

As another example, the managing unit 18 performs network operations, network administration, and/or network maintenance. Network operations includes authenticating user data allocation requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10.

The integrity processing unit 20 performs rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in the DSN memory 22.

FIG. 2 is a schematic block diagram of an embodiment of a computing core 26 that includes a processing module 50, a memory controller 52, main memory 54, a video graphics processing unit 55, an input/output (10) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSN interface module 76 and/or the network interface module 70 may function as one or more of the interface 30-33 of FIG. 1. Note that the IO device interface module 62 and/or the memory interface modules 66-76 may be collectively or individually referred to as IO ports.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. The dispersed storage error encoding parameters include an encoding function (e.g., information dispersal algorithm, Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity checksum, etc.).

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of 5, a decode threshold of 3, a read threshold of 4, and a write threshold of 4. In accordance with the data segmenting protocol, the computing device 12 or 16 divides the data (e.g., a file (e.g., text, video, audio, etc.), a data object, or other data arrangement) into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number.

Returning to the discussion of FIG. 3, the computing device also creates a slice name (SN) for each encoded data slice (EDS) in the set of encoded data slices. A typical format for a slice name 60 is shown in FIG. 6. As shown, the slice name (SN) 60 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as, at least part of, a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN 5_Y.

Figures 7, 8:
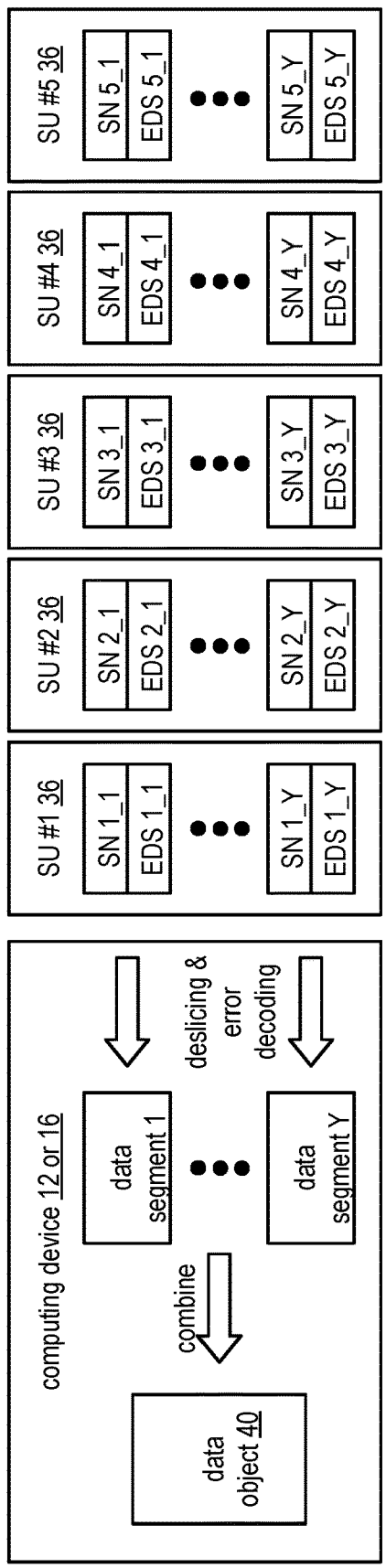
FIG. 7 is a schematic block diagram of an example of dispersed storage error decoding of data in accordance with the present invention.
FIG. 8 is a schematic block diagram of a generic example of an error decoding function in accordance with the present invention.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

To recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

Figure 9:
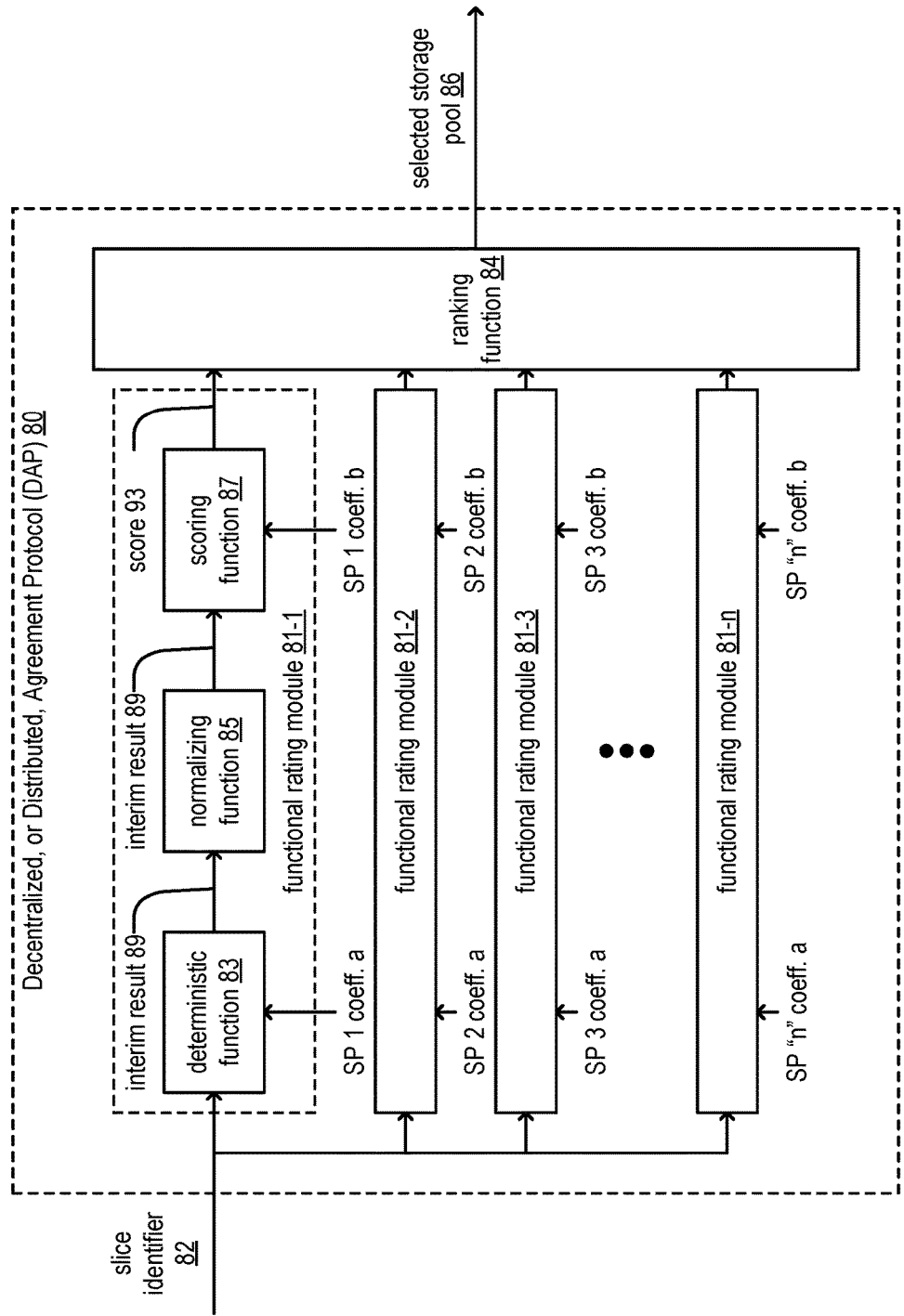
FIG. 9 is a schematic block diagram of an embodiment of a Decentralized, or Distributed, Agreement Protocol (DAP) in accordance with the present invention.

FIG. 9 is a schematic block diagram 900 of an embodiment of a Decentralized, or Distributed, Agreement Protocol (DAP) 80 that may be implemented by a computing device, a storage unit, and/or any other device or unit of the DSN to determine where to store encoded data slices or where to find stored encoded data slices. The DAP 80 includes a plurality of functional rating modules 81. Each of the functional rating modules 81 includes a deterministic function 83, a normalizing function 85, and a scoring function 87.

Each functional rating module 81 receives, as inputs, a slice identifier 82 and storage pool (SP) coefficients (e.g., a first functional rating module 81-1 receives SP 1 coefficients "a" and b). Based on the inputs, where the SP coefficients are different for each functional rating module 81, each functional rating module 81 generates a unique score 93 (e.g., an alpha-numerical value, a numerical value, etc.). The ranking function 84 receives the unique scores 93 and orders them based on an ordering function (e.g., highest to lowest, lowest to highest, alphabetical, etc.) and then selects one as a selected storage pool 86. Note that a storage pool includes one or more sets of storage units 86. Further note that the slice identifier 82 corresponds to a slice name or common attributes of set of slices names. For example, for a set of encoded data slices, the slice identifier 120 specifies a data segment number, a vault ID, and a data object ID, but leaves open ended, the pillar number. As another example, the slice identifier 82 specifies a range of slice names (e.g., 0000 0000 to FFFF FFFF).

As a specific example, the first functional module 81-1 receives the slice identifier 82 and SP coefficients for storage pool 1 of the DSN. The SP coefficients includes a first coefficient (e.g., "a") and a second coefficient (e.g., "b"). For example, the first coefficient is a unique identifier for the corresponding storage pool (e.g., SP #1's ID for SP 1 coefficient "a") and the second coefficient is a weighting factor for the storage pool. The weighting factors are derived to ensure, over time, data is stored in the storage pools in a fair and distributed manner based on the capabilities of the storage units within the storage pools.

For example, the weighting factor includes an arbitrary bias which adjusts a proportion of selections to an associated location such that a probability that a source name will be mapped to that location is equal to the location weight divided by a sum of all location weights for all locations of comparison (e.g., locations correspond to storage units). As a specific example, each storage pool is associated with a location weight factor based on storage capacity such that, storage pools with more storage capacity have a higher location weighting factor than storage pools with less storage capacity.

The deterministic function 83, which may be a hashing function, a hash-based message authentication code function, a mask generating function, a cyclic redundancy code function, hashing module of a number of locations, consistent hashing, rendezvous hashing, and/or a sponge function, performs a deterministic function on a combination and/or concatenation (e.g., add, append, interleave) of the slice identifier 82 and the first SP coefficient (e.g., SU 1 coefficient "a") to produce an interim result 89.

The normalizing function 85 normalizes the interim result 89 to produce a normalized interim result 91. For instance, the normalizing function 85 divides the interim result 89 by a number of possible output permutations of the deterministic function 83 to produce the normalized interim result. For example, if the interim result is 4,325 (decimal) and the number of possible output permutations is 10,000, then the normalized result is 0.4325.

The scoring function 87 performs a mathematical function on the normalized result 91 to produce the score 93. The mathematical function may be division, multiplication, addition, subtraction, a combination thereof, and/or any mathematical operation. For example, the scoring function divides the second SP coefficient (e.g., SP 1 coefficient "b") by the negative log of the normalized result (e.g., $e^y=x$ and/or $\ln(x)=y$). For example, if the second SP coefficient is 17.5 and the negative log of the normalized result is 1.5411 (e.g., $e^{(0.4235)}$), the score is 11.3555.

The ranking function 84 receives the scores 93 from each of the function rating modules 81 and orders them to produce a ranking of the storage pools. For example, if the ordering is highest to lowest and there are five storage units in the DSN, the ranking function evaluates the scores for five storage units to place them in a ranked order. From the ranking, the ranking module 84 selects one the storage pools 86, which is the target for a set of encoded data slices.

The DAP 80 may further be used to identify a set of storage units, an individual storage unit, and/or a memory device within the storage unit. To achieve different output results, the coefficients are changed according to the desired location information. The DAP 80 may also output the ranked ordering of the scores.

Figure 10:
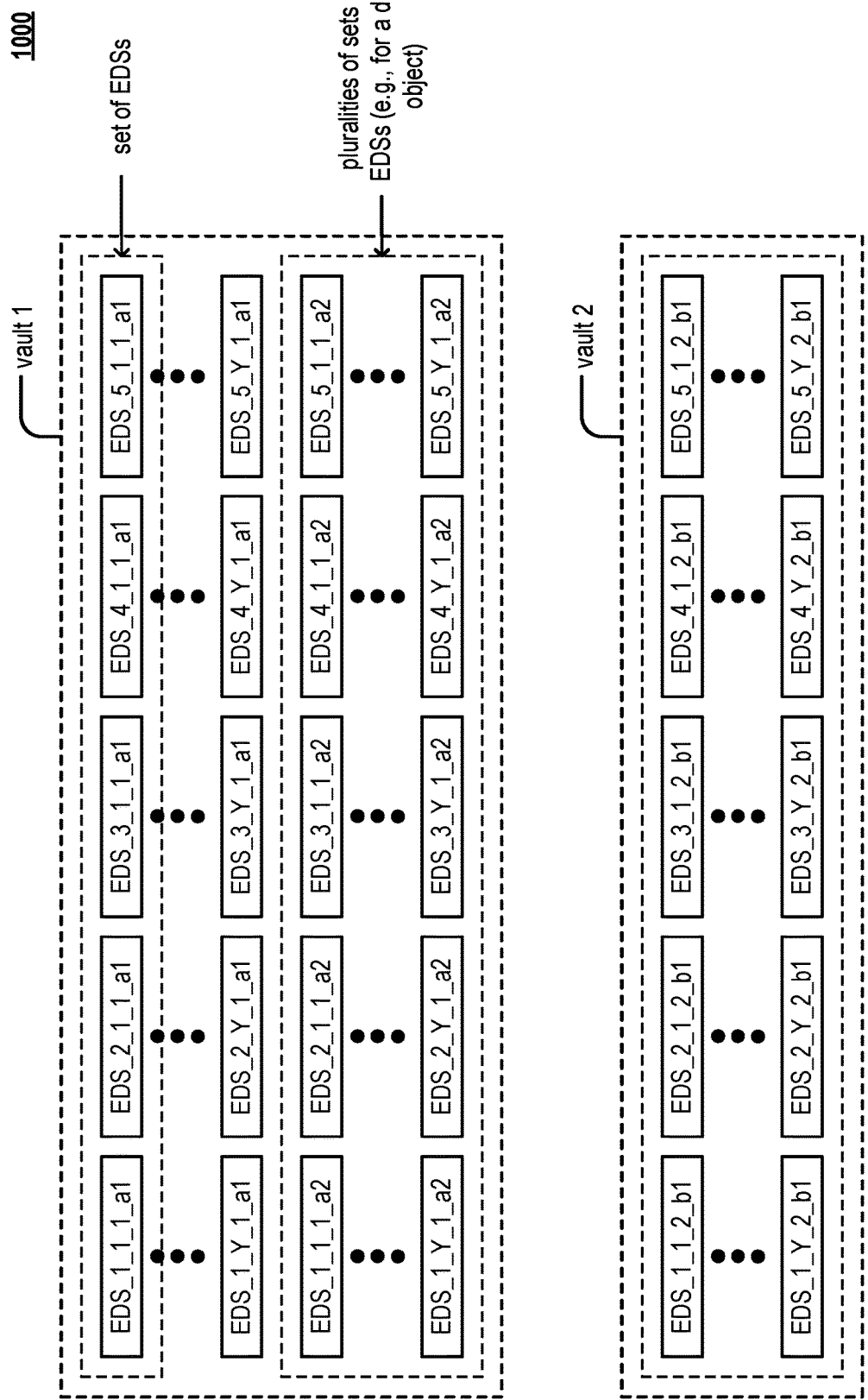
FIG. 10 is a schematic block diagram of an example of creating pluralities of sets of slices in accordance with the present invention.

FIG. 10 is a schematic block diagram 1000 of an example of creating pluralities of sets of slices. Each plurality of sets of encoded data slices (EDSs) corresponds to the encoding of a data object, a portion of a data object, or multiple data object, where a data object is one or more of a file, text, data, digital information, etc. For example, the highlighted plurality of encoded data slices corresponds to a data object having a data identifier of "a2".

Each encoded data slices of each set of encoded data slices is uniquely identified by its slice name, which is also used as at least part of the DSN address for storing the encoded data slice. As shown, a set of EDSs includes EDS 1_1_1_a1 through EDS 5_1_1_a1. The EDS number includes pillar number, data segment number, vault ID, and data object ID. Thus, for EDS 1_1_1_a1, it is the first EDS of a first data segment of data object "a1" and is to be stored, or is stored, in vault 1. Note that vaults are a logical memory container supported by the storage units of the DSN. A vault may be allocated to one or more user computing devices.

As is further shown, another plurality of sets of encoded data slices are stored in vault 2 for data object "b1". There are Y sets of EDSs, where Y corresponds to the number of data segments created by segmenting the data object. The last set of EDSs of data object "b1" includes EDS 1_Y_2_b_1 through EDS 5_Y_2_b_1. Thus, for EDS 1_Y_2_b_1, it is the first EDS of the last data segment "Y" of data object "b1" and is to be stored, or is stored, in vault 2.

Figure 11:
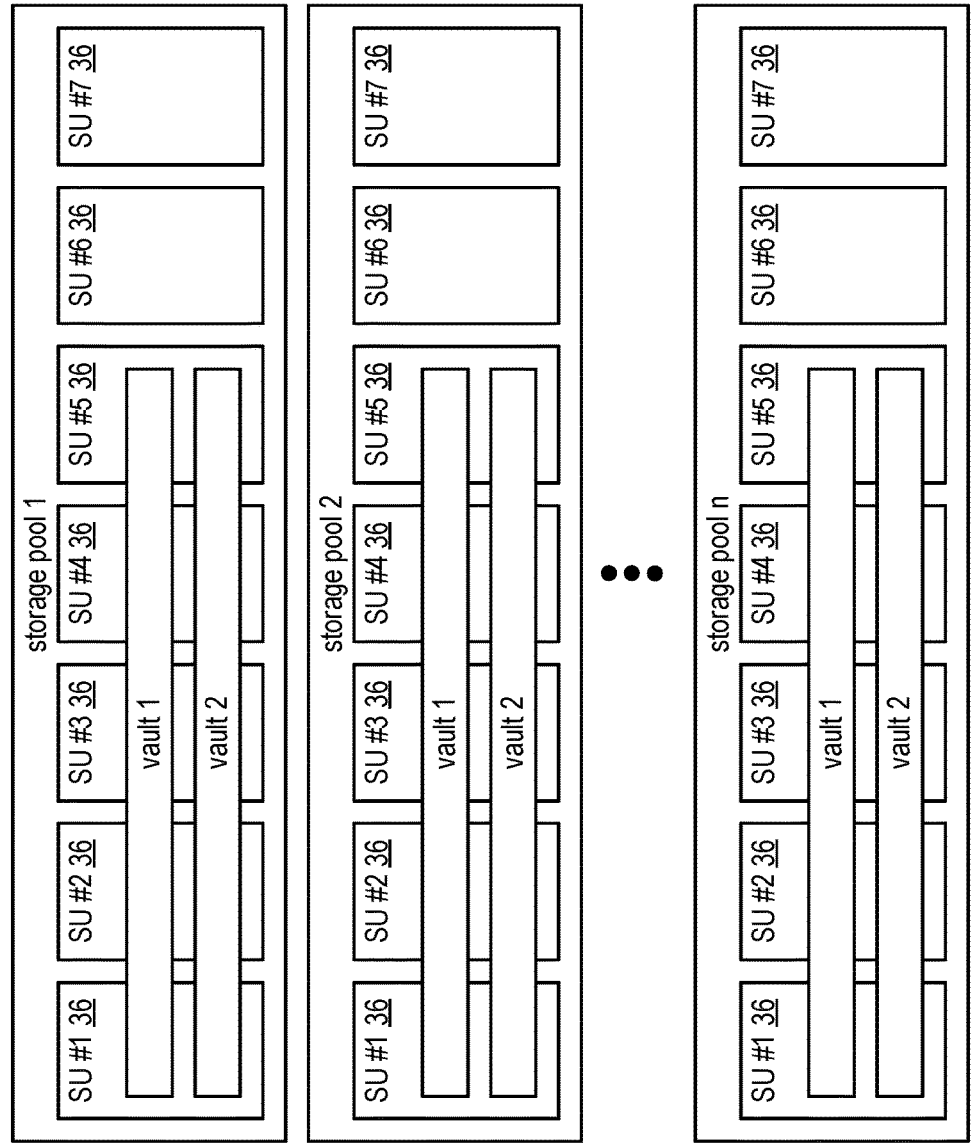
FIG. 11 is a schematic block diagram of an example of storage vaults in accordance with the present invention.

FIG. 11 is a schematic block diagram 1100 of an example of storage vaults spanning multiple storage pools. In this example, the DSN memory 22 includes a plurality of storage units 36 arranged into a plurality of storage pools (e.g., 1-n). In this example, each storage pool includes seven storage units for ease of illustration. A storage pool, however, can have many more storage units than seven and, from storage pool to storage pool, may have different numbers of storage units.

The storage pools 1-n support two vaults (vault 1 and vault 2) using only five of seven of the storage units. The number of storage units within a vault correspond to the pillar width number, which is five in this example. Note that a storage pool may have rows of storage units, where SU #1 represents a plurality of storage units, each corresponding to a first pillar number; SU #2 represents a second plurality of storage units, each corresponding to a second pillar number; and so on. Note that other vaults may use more or less than a width of five storage units.

Figure 12:
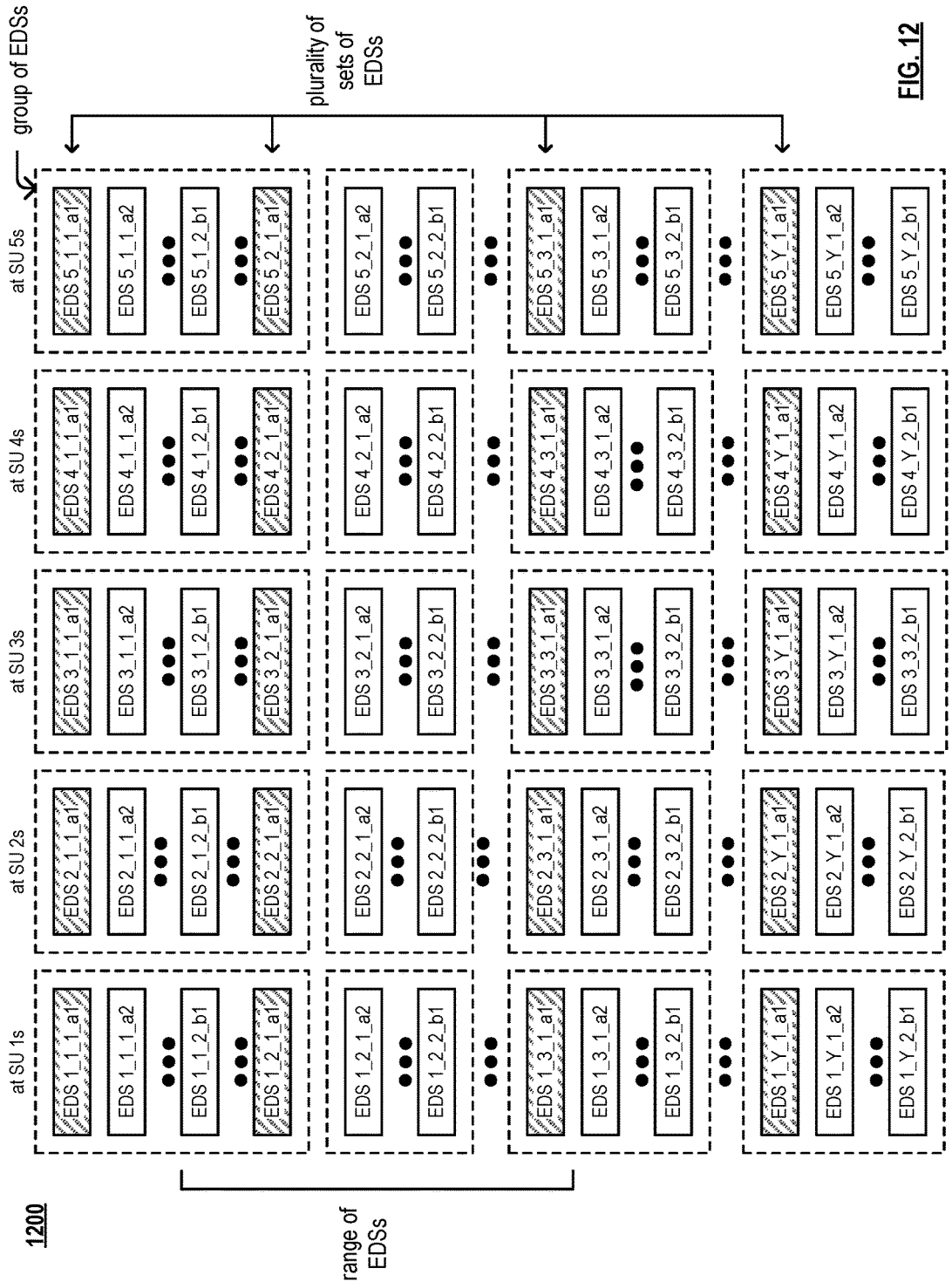
FIG. 12 is a schematic block diagram of an example of storing pluralities of sets of slices in accordance with the present invention.

FIG. 12 is a schematic block diagram 1200 of an example of storing pluralities of sets of slices in accordance with the Decentralized, or Distributed, Agreement Protocol (DAP) 80 of FIG. 9. The DAP 80 uses slice identifiers (e.g., the slice name or common elements thereof (e.g., the pillar number, the data segment number, the vault ID, and/or the data object ID)) to identify, for one or more sets of encoded data slices, a set, or pool, of storage units. With respect to the three pluralities of sets of encoded data slices (EDSs) of FIG. 11, the DAP 80 approximately equally distributes the sets of encoded data slices throughout the DSN memory (e.g., among the various storage units).

The first column corresponds to storage units having a designation of SU #1 in their respective storage pool or set of storage units and stores encoded data slices having a pillar number of 1. The second column corresponds to storage units having a designation of SU #2 in their respective storage pool or set of storage units and stores encoded data slices having a pillar number of 2, and so on. Each column of EDSs is divided into one or more groups of EDSs. The delineation of a group of EDSs may correspond to a storage unit, to one or more memory devices within a storage unit, or multiple storage units. Note that the grouping of EDSs allows for bulk addressing, which reduces network traffic.

A range of encoded data slices (EDSs) spans a portion of a group, spans a group, or spans multiple groups. The range may be numerical range of slice names regarding the EDSs, one or more source names (e.g., common aspect shared by multiple slice names), a sequence of slice names, or other slice selection criteria.

Figure 13:
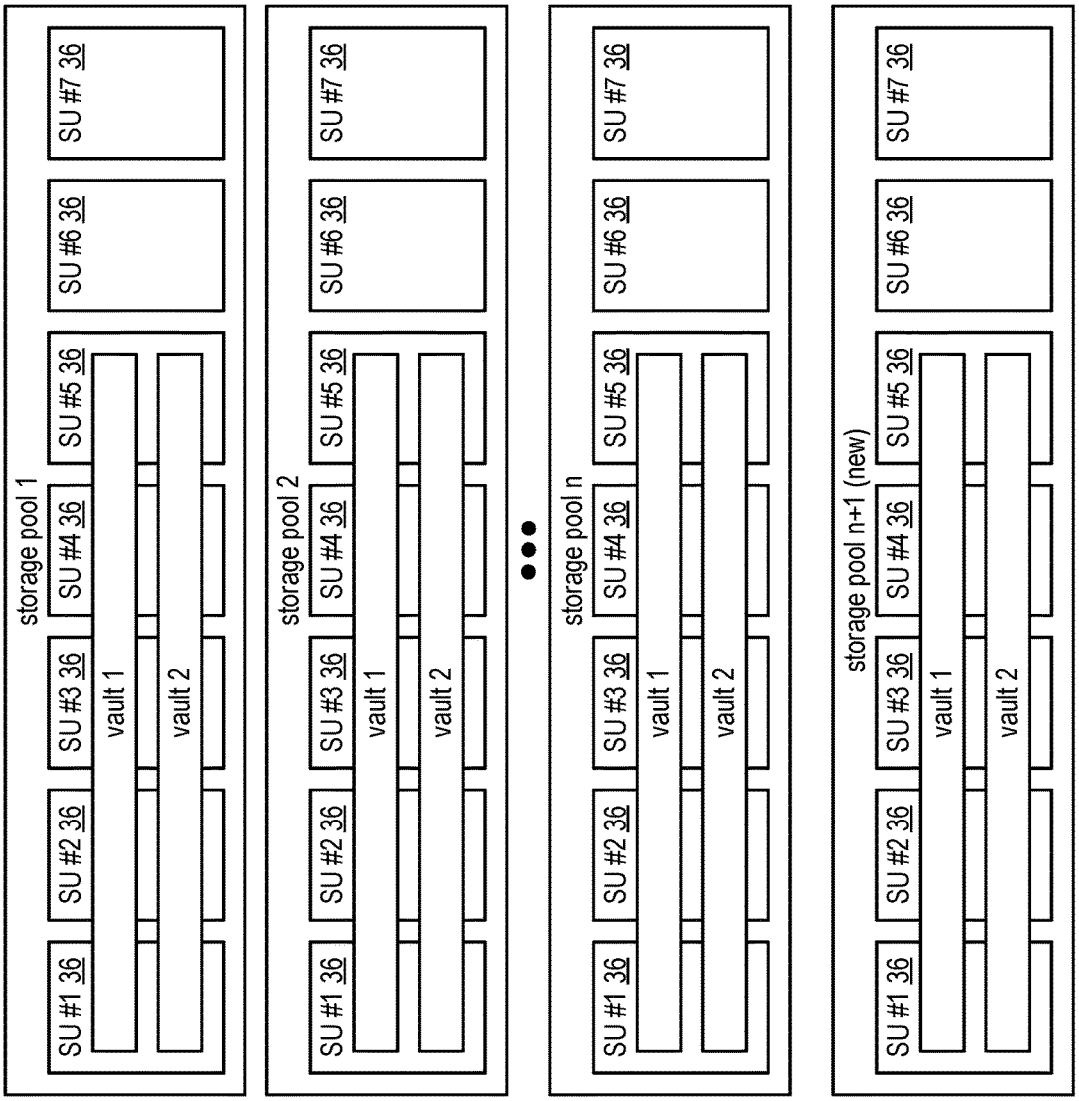
FIG. 13 is a schematic block diagram of an example of adding a storage pool to the DSN in accordance with the present invention.

FIG. 13 is a schematic block diagram 1300 of an example of adding a storage pool to the DSN. In this example storage pool n+1 is added and is supporting vaults 1 and 2. As result, the Decentralized, or Distributed, Agreement Protocol (DAP) 80 of FIG. 9 is changed to include another functional rating module 81 for the new storage pool and the second coefficients (e.g., "b", which correspond to the weight factor) are adjusted for some, if not all, of the other functional rating modules 81. As a result of changing the DAP 80, storage responsibility for encoded data slices is going to change, causing them to be transferred between the storage units. When there are significant numbers of encoded data slices to be transferred and there are hundreds to tens of thousands of resources in the DSN (e.g., computing devices, storage units, managing units, integrity units performing rebuilding, etc.), the updating of the DSN is complex and time consuming.

While the DSN is being updated based on the new DAP, data access requests, listing requests, and other types of requests regarding the encoded data slices are still going to be received and need to be processed in a timely manner. Such requests will be based on the old DAP. As such, a request for an encoded data slice (EDS), or information about the EDS, will go to the storage unit identified using the DAP 80 prior to updating it. If the storage unit has already transferred the EDS to the storage unit identified using the new DAP 80, then the storage unit functions as proxy for the new storage unit and the requesting device.

Figure 14:
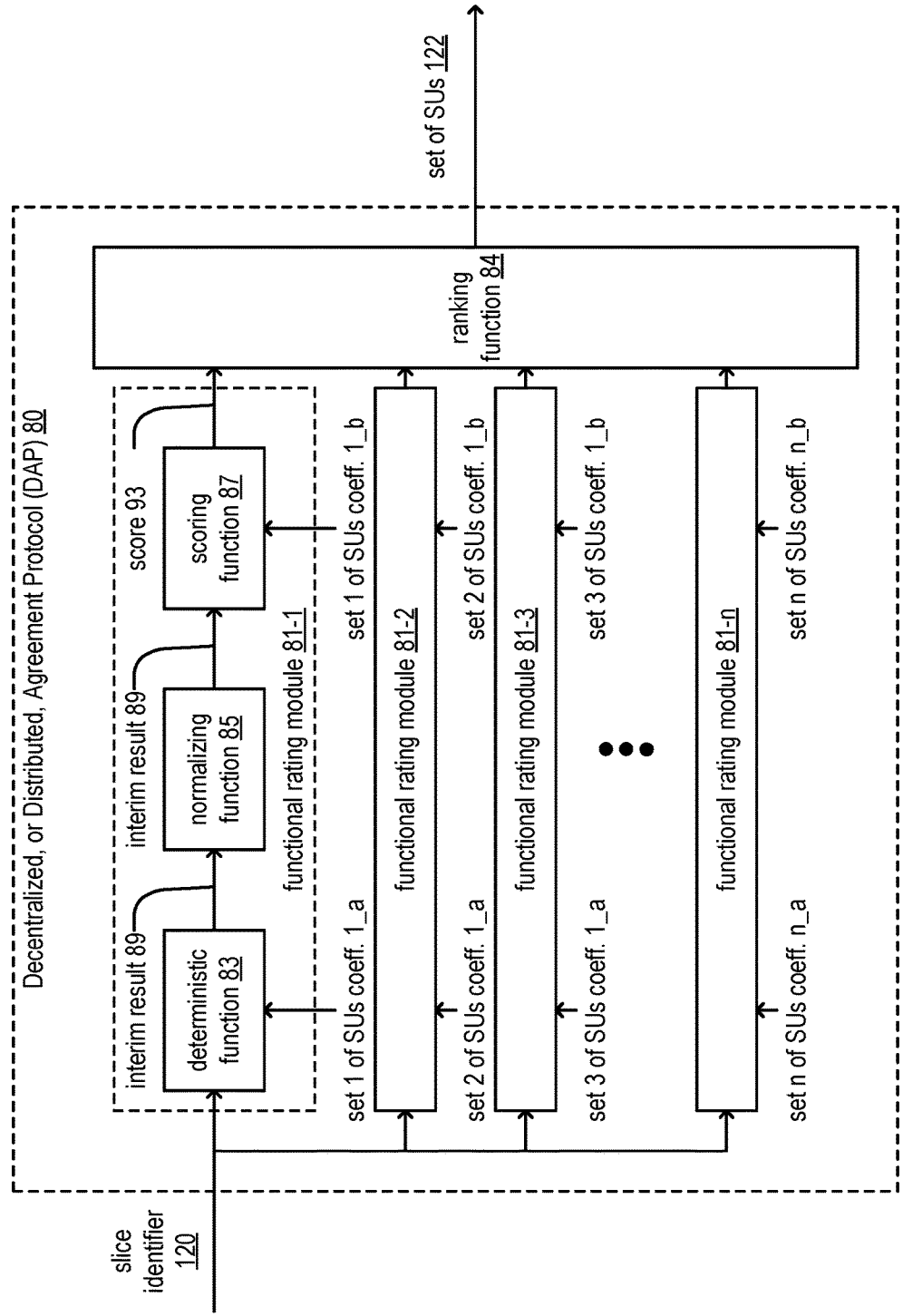
FIG. 14 is a schematic block diagram of an embodiment of a decentralized, or distributed, agreement protocol (DAP) for generating identified set of storage units in accordance with the present invention.

FIG. 14 is a schematic block diagram 1400 of an embodiment of a decentralized, or distributed, agreement protocol (DAP) for generating identified set of storage units in accordance with the present invention. The DAP 80 is similar to the DAP of FIG. 9, but uses a slice identifier 120 instead of a source name 82, uses coefficients for a set of storage units instead of for individual storage units, and the ranking function 84 outputs an identified set of storage units 122 instead of a storage unit ranking 86. The slice identifier 120 corresponds to a slice name or common attributes of set of slices names. For example, for a set of encoded data slices, the slice identifier 120 specifies a data segment number, a vault ID, and a data object ID, but leaves open ended, the pillar number.

In an example of the operation, each of the functional rating modules 81 generates a score 93 for each set of the storage units based on the slice identifier 120. The ranking function 84 orders the scores 93 to produce a ranking. But, instead of outputting the ranking, the ranking function 84 outputs one of the scores, which corresponds to the identified set of storage units.

As can be seen, such a DAP may be implemented and executed for many different applications including for the determination of where to store encoded data slices or where to find stored encoded data slices such as with respect to FIG. 9 as well as the identification of a set of storage units (SUs) such as with respect to FIG. 14. Based on differently provided input to the DAP, differently provided information may be output. Generally speaking, the more detailed information is that is provided to the DAP, then the more detailed information will be output when from the DAP when executed.

Figure 15:
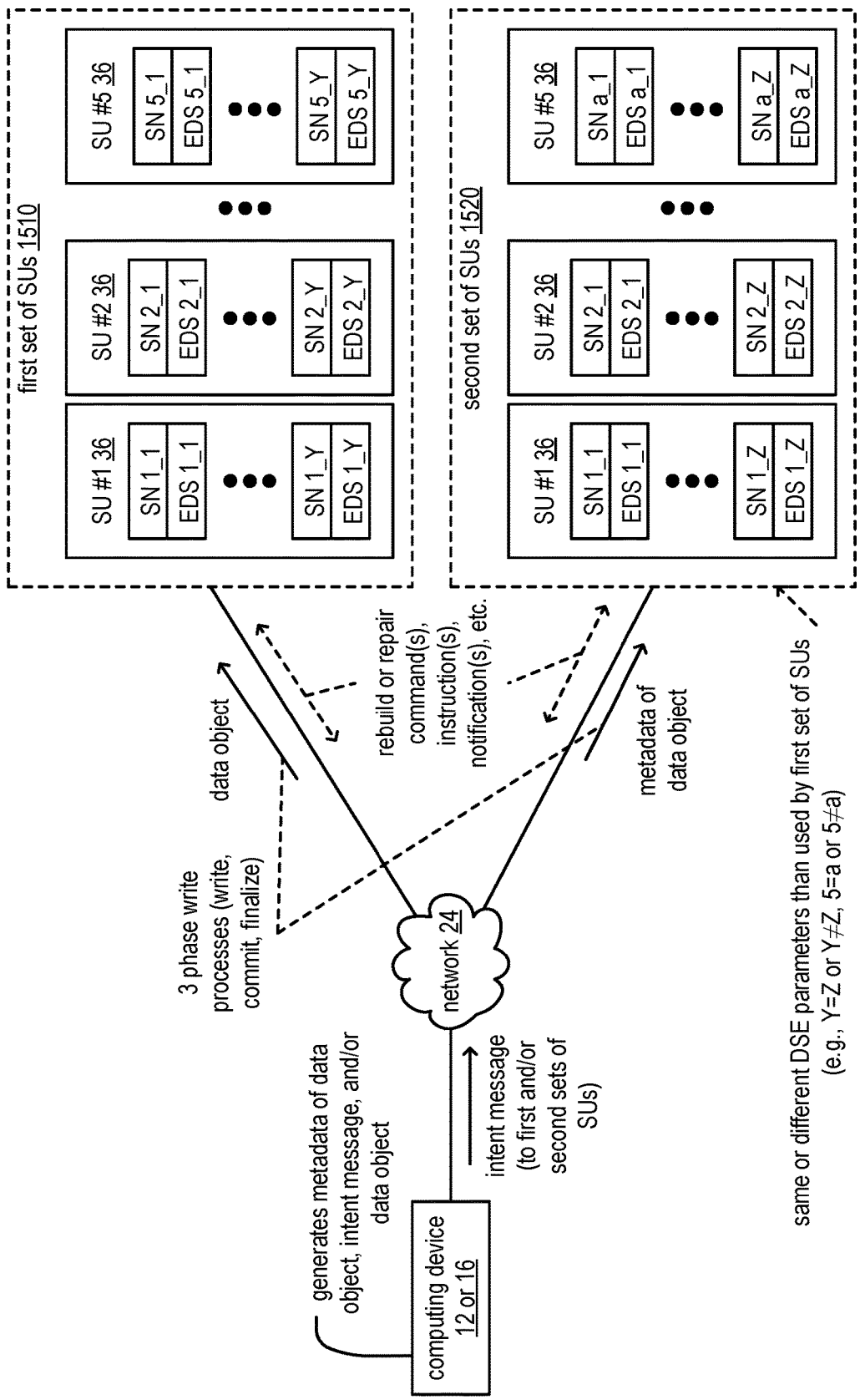
FIG. 15 is a schematic block diagram of another embodiment of a DSN in accordance with the present invention.

FIG. 15 is a schematic block diagram 1500 of another embodiment of a DSN in accordance with the present invention. A DSN includes a computing device 12 or 16 that is configured to interact with a first set of SUs 1610 (e.g., that includes storage units (SUs) that store encoded data slices (EDSs) corresponding to a data object) via network 24. Also, the computing device 12 or 16 is configured to interact with a second set of SUs 1620 (e.g., that includes other storage units (SUs) that store other encoded data slices (EDSs) corresponding to a metadata of the data object) via network 24. In general, metadata of the data object may be viewed as data that is different than the data object itself and provides information about the data object. Examples of metadata of the data object may include any one or more of at least some information address associated with the data object such as a source name associated with a source of the data object, vault information, etc., type of data of the data object, size of the data object, a revision number of the data object, a current Decentralized, or Distributed, Agreement Protocol (DAP) system configuration associated with the data object, an author of the data object, a creation date or time of the data object, purpose of the data object, other data objects related to the data object, a file extension of the data object, one or more applications with which the data object is operable and may be used, characteristics of the data object, and/or any other information about the data object, etc.

The data object is distributedly stored in the first set of SUs 1510 in accordance with a set of dispersed error encoding parameters. For example, the data object is segmented into a plurality of data segments (e.g., Y segments, wherein Y is a positive integer greater than or equal to 2), and a data segment of the plurality of data segments is dispersed error encoded in accordance with dispersed error encoding parameters to produce a set of encoded data slices (EDSs) that is of pillar width (e.g., such as 5). Note that a decode threshold number of EDSs are needed to recover the data segment, and a read threshold number of EDSs provides for reconstruction of the data segment. Note also that a write threshold number of EDSs provides for a successful transfer of the set of EDSs from a first at least one location in the DSN to a second at least one location in the DSN.

Also, the metadata of the data object is distributedly stored in the second set of SUs 1520 in accordance with a set of dispersed error encoding parameters (or alternatively, another set of dispersed error encoding parameters). For example, the metadata of the data object may be segmented into a same number of data segments into which the data object is segmented (e.g., Y) or a different number (e.g., wherein Z is a positive integer greater than or equal to 2 and that is different than Y). A data segment of the plurality of data segments of the metadata of the data object is dispersed error encoded in accordance with the dispersed error encoding parameters to produce another set of EDSs that is of pillar width (e.g., such as 5) or in accordance with the other set of dispersed error encoding parameters (e.g., such as pillar width of 'a', wherein 'a' is a positive integer greater than or equal to 2 and that is different than 5 when the pillar width based on the set of dispersed error encoding parameters includes a pillar width of 5).

In an example of operation and implementation, a SU includes an interface configured to interface and communicate with a dispersed or distributed storage network (DSN), a memory that stores operational instructions, and a processing module operably coupled to the interface and memory such that the processing module, when operable within the SU based on the operational instructions, is configured to perform various operations.

In an example, the SU is configured to store, based on a first write command from computing device 12 of 16, at least one encoded data slice (EDS) of a first set of encoded data slices (EDSs) corresponding to a data object that are distributedly stored in a first plurality of SUs 1510 that includes the SU within the DSN. Note that the data object is segmented into a first plurality of data segments, and a data segment of the first plurality of data segments is dispersed error encoded in accordance with dispersed error encoding parameters to produce the first set of EDSs. The SU is also configured to store, based on a second write command from the computing device 12 or 16 (or another computing device), an intent message that includes specifications for consistency between the data object and metadata of the data object. Note that a second set of EDSs corresponding to the metadata of the data object are distributedly stored in a second plurality of SUs 1520 within the DSN. The metadata is segmented into a second plurality of data segments, and a data segment of the second plurality of data segments is dispersed error encoded in accordance with the dispersed error encoding parameters (or other dispersed error encoding parameters) to produce the second set of EDSs.

The SU is also configured to service the intent message to determine whether the data object and the metadata of the data object are consistent based on the specifications. For example, the specifications may include information such that the consistency between the data object and the metadata of the data object is based on versions thereof Alternatively, in another example, the specifications may include information such that the consistency between the data object and the metadata of the data object is based on associated Decentralized, or Distributed, Agreement Protocol (DAP) system configuration. Alternatively, in yet another example, the specifications may include information such that the consistency between the data object and the metadata of the data object is based on information associated with the data (e.g., such as information associated with the actual data itself) and/or the metadata of the data object (e.g., such as actual information included in the metadata). In general, the specifications may include any information by which the consistency between the data object and the metadata of the data object is to be determined and on which it is to be based.

When the data object and the metadata of the data object are determined to be consistent based on the service the intent message, the SU is configured to delete the intent message that is stored in the SU. Alternatively, when the data object and the metadata of the data object are determined to be inconsistent based on the servicing the intent message, the SU is configured to eliminate inconsistency between the data object and the metadata of the data object within the DSN.

In some examples, the SU is also configured to determine a time at or during which to service the intent message. In one example, the SU determines when to service the intent message based on information included within the intent message. In another example, the SU determines to service the intent message when the SU has adequate processing resources available (e.g., is not fully or largely occupied performed other processes, etc.). In even other examples, the SU selects the time at or during which to service the intent message based on expected or estimated use of processing resources and an estimation of when there will be adequate processing resources available.

Also, in some examples, the SU is configured to eliminate the inconsistency between the data object and the metadata of the data object by performing one or more of various operations. In a first example, the SU performs this by transmitting a delete command via the DSN for at least one of the first set of EDSs corresponding to the data object that are distributedly stored in the first plurality of SUs or the second set of EDSs corresponding to the metadata of the data object that are distributedly stored in the second plurality of SUs. In a second example, the SU performs this by transmitting a first repair command via the DSN to repair (e.g., which may include rebuild) the first set of EDSs corresponding to the data object that are distributedly stored in the first plurality of SUs to be consistent with the second set of EDSs corresponding to the metadata of the data object that are distributedly stored in the second plurality of SUs. In a third second example, the SU performs this by transmitting a second repair command via the DSN to repair (e.g., which may include rebuild) the second set of EDSs corresponding to the metadata of the data object that are distributedly stored in the second plurality of SUs to be consistent with the first set of EDSs corresponding to the data object that are distributedly stored in the first plurality of SUs.

In even other examples, when the data object and the metadata of the data object are determined to be inconsistent based on the servicing of the intent message, the SU is further configured to transmit a notification of inconsistency between the data object and the metadata of the data object to the computing device (e.g., computing device 12 or 16 or another computing device, such as a computing device that is associated with a user). The SU is also configured to receive an instruction message from the computing device associated with the user that specifies an operation to be performed by the SU to eliminate the inconsistency between the data object and the metadata of the data object and then to perform the operation specified in the instruction message to eliminate the inconsistency between the data object and the metadata of the data object.

In yet other examples, the SU is configured to determine the data object and the metadata of the data object are inconsistent based on the specifications when a commit phase or a finalize phase (e.g., of a 3 phase write process that includes a write phase, the commit phase, and the finalize phase for storage) of the first set of EDSs corresponding to the data object within the first plurality of SUs that includes the SU within the DSN and/or the second set of EDSs corresponding to the metadata of the data object within the second plurality of SUs within the DSN is determined to have failed.

In even other examples, the SU is configured to determine, when servicing the intent message to determine whether the data object and the metadata of the data object are consistent based on the specifications, that the data object and the metadata of the data object are consistent when a first version of the at least one EDS of the first set of EDSs corresponding to the data object compares favorably with a second version of the second set of EDSs corresponding to the metadata of the data object. For example, when the data object and/or the metadata of the data object gets updated, a version or revision level of the data object and/or the metadata of the data object may be changed as well. Also, when the data object and/or the metadata of the data object gets rebuilt or repaired, the version or revision level of the data object and/or the metadata of the data object may be changed as well. In general, when the data object and/or the metadata of the data object gets changed in one or more ways, the version or revision level of the data object and/or the metadata of the data object can be changed as well.

Alternatively or in addition to, when servicing the intent message to determine whether the data object and the metadata of the data object are consistent based on the specifications, the SU is configured to determine that the data object and the metadata of the data object are consistent when a first system configuration of a Decentralized, or Distributed, Agreement Protocol (DAP) of the DSN that corresponds to storage of the at least one EDS of the first set of EDSs corresponding to the data object compares favorably with a second system configuration of the DAP of the DSN that corresponds to storage of the second set of EDSs corresponding to the metadata of the data object. For example, when the DSN changes a system configuration from a first to a second system configuration, the system configuration associated with both the data object and the metadata of the data object should be updated. However, for one or more reasons, perhaps one of the data object or the metadata of the data failed to get updated to be updated from the first to the second system configuration. In such an instance of failure to update from the first to the second system configuration for the data object or the metadata of the data, the first system configuration of the DAP of the DSN that corresponds to storage of the at least one EDS of the first set of EDSs corresponding to the data object will compare unfavorably with a second system configuration of the DAP of the DSN that corresponds to storage of the second set of EDSs corresponding to the metadata of the data object.

Note that the SU may be located at a first premises that is remotely located from at least one SU of at least one SU of the first plurality of SUs or the second plurality of SUs within the DSN. Also, note that the computing device may be of any of a variety of types of devices as described herein and/or their equivalents including a SU of any group and/or set of SUs within the DSN, a wireless smart phone, a laptop, a tablet, a personal computers (PC), a work station, and/or a video game device. Note also that the DSN may be implemented to include or be based on any of a number of different types of communication systems including a wireless communication system, a wire lined communication systems, a non-public intranet system, a public internet system, a local area network (LAN), and/or a wide area network (WAN).

Figure 16:
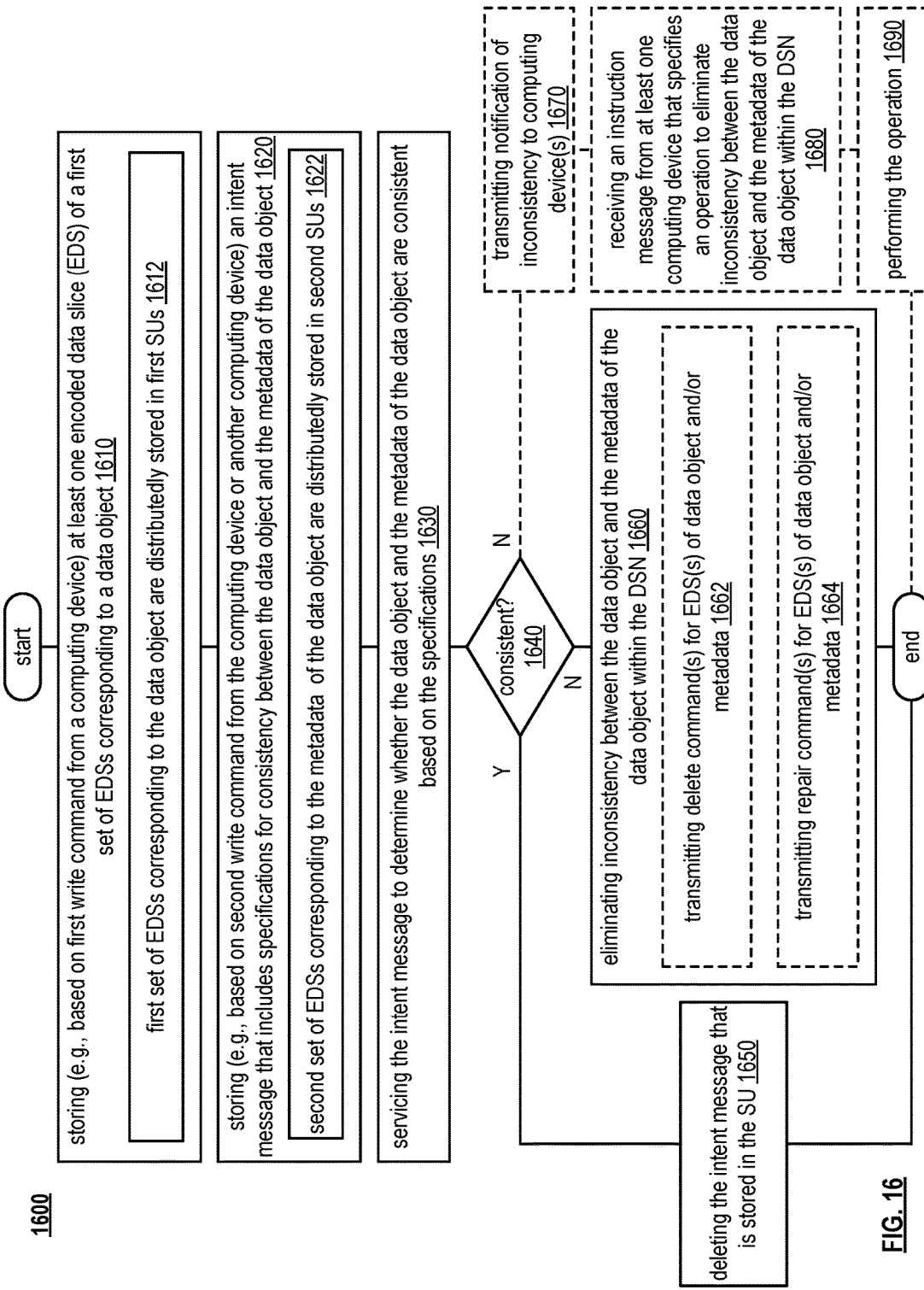
FIG. 16 is a diagram illustrating an embodiment of a method for execution by one or more computing devices in accordance with the present invention.

FIG. 16 is a diagram illustrating an embodiment of a method 1660 for execution by one or more computing devices (e.g., such as a storage unit (SU)) in accordance with the present invention. In some examples, the method 1600 is a method for execution by a storage unit (SU). In general, the method 1600 may be performed by any device as described herein or their equivalents including a computing device.

The method 1600 begins in step 1610 by storing (e.g., based on a first write command from a computing device that is received via an interface of the SU that is configured to interface and communicate with a dispersed or distributed storage network (DSN)) at least one encoded data slice (EDS) of a first set of encoded data slices (EDSs) corresponding to a data object. In some examples, the first set of EDSs are distributedly stored in a first plurality of SUs that includes the SU within the DSN as shown in step 1612. Note that the data object is segmented into a first plurality of data segments, and a data segment of the first plurality of data segments is dispersed error encoded in accordance with dispersed error encoding parameters to produce the first set of EDSs. With respect to the data object, a decode threshold number of the first set of EDSs are needed to recover the data segment, and a read threshold number of the first set of EDSs provides for reconstruction of the data segment. Also, a write threshold number of the first set of EDSs provides for a successful transfer of the first set of EDSs from a first at least one location in the DSN to a second at least one location in the DSN.

The method 1600 continues in step 1620 by storing, (e.g., based on a second write command from the computing device or another computing device that is received via the interface of the SU) an intent message that includes specifications for consistency between the data object and metadata of the data object. In some examples, a second set of EDSs corresponding to the metadata of the data object are distributedly stored in a second plurality of SUs within the DSN as shown in step 1622. Note that the metadata is segmented into a second plurality of data segments, and a data segment of the second plurality of data segments is dispersed error encoded in accordance with the dispersed error encoding parameters or other dispersed error encoding parameters to produce the second set of EDSs. With respect to the metadata of the data object, a decode threshold number of the first set of EDSs are needed to recover the data segment, and a read threshold number of the first set of EDSs provides for reconstruction of the data segment. Also, a write threshold number of the first set of EDSs provides for a successful transfer of the first set of EDSs from a first at least one location in the DSN to a second at least one location in the DSN.

The method 1600 then operates in step 1630 by servicing the intent message to determine whether the data object and the metadata of the data object are consistent based on the specifications.

When the data object and the metadata of the data object are determined to be consistent in step 1640, the method 1600 branches to step 1650 and operates by deleting the intent message that is stored in the SU.

Alternatively, when the data object and the metadata of the data object are determined to be inconsistent based on the service the intent message in step 1640, the method 1600 branches to step 1660 and operates by eliminating inconsistency between the data object and the metadata of the data object within the DSN. In some examples, the operations of the step 1660 also operate by performing step 1662 that includes transmitting (e.g., via the interface of the SU and via the DSN) at least one delete command for at least one of the set of EDSs corresponding to the data object and/or the metadata of the data object that are distributedly stored in the first and/or second plurality of SUs. For example, this may involve transmitting (e.g., via the interface of the SU and via the DSN) a delete command for at least one of the first set of EDSs corresponding to the data object that are distributedly stored in the first plurality of SUs or the second set of EDSs corresponding to the metadata of the data object that are distributedly stored in the second plurality of SUs.

Also or alternatively, in some examples, the operations of the step 1660 also operate by performing step 1664 that includes transmitting (e.g., via the interface of the SU and via the DSN) at least one repair or rebuild command for at least one of the set of EDSs corresponding to the data object and/or the metadata of the data object that are distributedly stored in the first and/or second plurality of SUs. For example, this may involve transmitting (e.g., via the interface of the SU and via the DSN) a first repair command to repair the first set of EDSs corresponding to the data object that are distributedly stored in the first plurality of SUs to be consistent with the second set of EDSs corresponding to the metadata of the data object that are distributedly stored in the second plurality of SUs. This may also involve transmitting (e.g., via the interface of the SU and via the DSN) a second repair command to repair the second set of EDSs corresponding to the metadata of the data object that are distributedly stored in the second plurality of SUs to be consistent with the first set of EDSs corresponding to the data object that are distributedly stored in the first plurality of SUs.

In even other examples, when the data object and the metadata of the data object are determined to be inconsistent based on the service the intent message in step 1640, the method 1600 branches to step 1670 and operates by transmitting (e.g., via the interface of the SU and via the DSN) a notification of inconsistency between the data object and the metadata of the data object to the computing device, wherein the computing device is associated with a user. In this situation, the method 1600 then operates in step 1680 by receiving (e.g., via the interface of the SU and via the DSN) an instruction message from the computing device associated with the user that specifies an operation to be performed by the SU to eliminate the inconsistency between the data object and the metadata of the data object. The method 1600 then continues in step 1690 by performing the operation specified in the instruction message to eliminate the inconsistency between the data object and the metadata of the data object.

In even other examples, alternative embodiments of the method 1600 operate by determining the data object and the metadata of the data object are inconsistent based on the specifications when a commit phase or a finalize phase of a 3 phase write process that includes a write phase, the commit phase, and the finalize phase for storage of the first set of EDSs corresponding to the data object within the first plurality of SUs that includes the SU within the DSN or the second set of EDSs corresponding to the metadata of the data object within the second plurality of SUs within the DSN is determined to have failed. For example, as each of the data object and the metadata of the data object undergoes a 3 phase write process (e.g., to different sets of SUs), then when all 4 of those steps have succeeded for one of them, yet one or more of those 3 steps has failed for the other of them, then one of the 3 phase write processes will have been successful but the other one will have failed. As such, the data object and the metadata of the data object will be inconsistent.

In yet other examples, alternative embodiments of the method 1600 operate by determining, when servicing the intent message to determine whether the data object and the metadata of the data object are consistent based on the specifications, that the data object and the metadata of the data object are consistent when a first version of the at least one EDS of the first set of EDSs corresponding to the data object compares favorably with a second version of the second set of EDSs corresponding to the metadata of the data object. Alternatively, alternative embodiments of the method 1600 operate by determining, when servicing the intent message to determine whether the data object and the metadata of the data object are consistent based on the specifications, that the data object and the metadata of the data object are consistent when a first system configuration of a Decentralized, or Distributed, Agreement Protocol (DAP) of the DSN that corresponds to storage of the at least one EDS of the first set of EDSs corresponding to the data object compares favorably with a second system configuration of the DAP of the DSN that corresponds to storage of the second set of EDSs corresponding to the metadata of the data object.

This disclosure presents, among other things, various novel solutions that may be adapted for data storage systems that include data objects and non-embedded objects (e.g., such as metadata associated with one or more data objects). For example, for non-embedded objects, data that is written to a storage unit (SU) could be orphaned if the content written to the SU is successfully written, but the metadata failed to get updated, written successfully, or had a failure in some other aspect. This results in wasted data transfer and inaccurate or corrupted representation of data in the DSN memory. Various aspects, embodiments, and/or examples of the invention uses intents (e.g., intent messages) to ensure and/or guarantee that content (e.g., data, data objects, etc.) and metadata (e.g., associated with the data, data objects, etc.) are eventually consistent.

When a non-embedded object (e.g., metadata associated with a data object) gets written to the SU, the DS processing unit (e.g., which can be any device such as a computing device, etc.) would also write an intent (e.g., intent message) which contains information on the content and metadata of the object written. The intent (e.g., intent message) could, for example, contain the explicit segments (e.g., EDSs) that are expected to be written, the expected version of the object, the metadata, aspects of the data and/or metadata, characteristics of the data and/or metadata, etc. Note that the intent (e.g., intent message) could either be written firstly (e.g., before the writing of one or both of the data and/or metadata) or as an atomic operation upon write of the metadata (e.g., which can be written to the same set of SUs or a different set of SUs). In some examples, the SU would determine the appropriate time to service the written intent. For example, the SU could determine the appropriate time to service the written intent immediately or upon cleanup.

Within some embodiments and examples, servicing the intent entails that the intent processing entity (e.g., which can be a SU, a DS processing unit, and/or any other device such as a computing device, etc.) checks that the content and metadata of the object is consistent according to the specifications of the intent. In some examples, there are two outcomes upon the consistency check: (1) If they are consistent, then the intent is deleted, or alternatively, (2) Otherwise, the SU can determine how to react to the inconsistency. For example, the intent processing entity could delete the object entirely, send a notification to a user, attempt to repair the object, ignore it, etc. Various aspects, embodiments, and/or examples of the invention would eliminate inconsistent content and metadata in an efficient way.

It is noted that terminologies as may be used herein such as bit stream, stream, signal sequence, etc. (or their equivalents) have been used interchangeably to describe digital information whose content corresponds to any of a number of desired types (e.g., data, video, speech, audio, etc. any of which may generally be referred to as 'data').

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A storage unit (SU) comprising:
an interface configured to interface and communicate with a dispersed or distributed storage network (DSN);
memory that stores operational instructions; and
a processing module operably coupled to the interface and to the memory, wherein the processing module, when operable within the SU based on the operational instructions, is configured to:
store, based on a first write command that is received via the DSN and via the interface from a computing device, at least one encoded data slice (EDS) of a first set of encoded data slices (EDSs) corresponding to a data object that are distributedly stored in a first plurality of SUs that includes the SU within the DSN, wherein the data object is segmented into a first plurality of data segments, wherein a data segment of the first plurality of data segments is dispersed error encoded in accordance with dispersed error encoding parameters to produce the first set of EDSs;
store, based on a second write command that is received via the DSN and via the interface from the computing device or another computing device, an intent message that includes specifications for consistency between the data object and metadata of the data object, wherein a second set of EDSs corresponding to the metadata of the data object are distributedly stored in a second plurality of SUs within the DSN, wherein the metadata is segmented into a second plurality of data segments, wherein a data segment of the second plurality of data segments is dispersed error encoded in accordance with the dispersed error encoding parameters or other dispersed error encoding parameters to produce the second set of EDSs;
service the intent message to determine whether the data object and the metadata of the data object are consistent based on the specifications;
when the data object and the metadata of the data object are determined to be consistent based on the service the intent message, delete the intent message that is stored in the SU; and
when the data object and the metadata of the data object are determined to be inconsistent based on the service the intent message, eliminate inconsistency between the data object and the metadata of the data object within the DSN.

2. The SU of claim 1, wherein the processing module, when operable within the SU based on the operational instructions, is further configured to:
determine a time at or during which to service the intent message; and
eliminate the inconsistency between the data object and the metadata of the data object by:
transmitting a delete command via the DSN for at least one of the first set of EDSs corresponding to the data object that are distributedly stored in the first plurality of SUs or the second set of EDSs corresponding to the metadata of the data object that are distributedly stored in the second plurality of SUs;
transmitting a first repair command via the DSN to repair the first set of EDSs corresponding to the data object that are distributedly stored in the first plurality of SUs to be consistent with the second set of EDSs corresponding to the metadata of the data object that are distributedly stored in the second plurality of SUs; or
transmitting a second repair command via the DSN to repair the second set of EDSs corresponding to the metadata of the data object that are distributedly stored in the second plurality of SUs to be consistent with the first set of EDSs corresponding to the data object that are distributedly stored in the first plurality of SUs.

3. The SU of claim 1, wherein the processing module, when operable within the SU based on the operational instructions and when the data object and the metadata of the data object are determined to be inconsistent based on the service the intent message, is further configured to:
transmit a notification of inconsistency between the data object and the metadata of the data object to the computing device, wherein the computing device is associated with a user;

receive an instruction message from the computing device associated with the user that specifies an operation to be performed by the SU to eliminate the inconsistency between the data object and the metadata of the data object; and perform the operation specified in the instruction message to eliminate the inconsistency between the data object and the metadata of the data object.

4. The SU of claim 1, wherein the processing module, when operable within the SU based on the operational instructions, is further configured to:

determine the data object and the metadata of the data object are inconsistent based on the specifications when a commit phase or a finalize phase of a 3 phase write process that includes a write phase, the commit phase, and the finalize phase for storage of the first set of EDSs corresponding to the data object within the first plurality of SUs that includes the SU within the DSN or the second set of EDSs corresponding to the metadata of the data object within the second plurality of SUs within the DSN is determined to have failed.

5. The SU of claim 1, wherein the processing module, when operable within the SU based on the operational instructions, is further configured to:

determine, when servicing the intent message to determine whether the data object and the metadata of the data object are consistent based on the specifications, that the data object and the metadata of the data object are consistent when a first version of the at least one EDS of the first set of EDSs corresponding to the data object compares favorably with a second version of the second set of EDSs corresponding to the metadata of the data object; or determine, when servicing the intent message to determine whether the data object and the metadata of the data object are consistent based on the specifications, that the data object and the metadata of the data object are consistent when a first system configuration of a Decentralized, or Distributed, Agreement Protocol (DAP) of the DSN that corresponds to storage of the at least one EDS of the first set of EDSs corresponding to the data object compares favorably with a second system configuration of the DAP of the DSN that corresponds to storage of the second set of EDSs corresponding to the metadata of the data object.

6. The SU of claim 1, wherein the SU is located at a first premises that is remotely located from at least one SU of at least one SU of the first plurality of SUs or the second plurality of SUs within the DSN.

7. The SU of claim 1, wherein the computing device includes another SU of the first plurality of SUs, an SU of the second plurality of SUs within the DSN, a wireless smart phone, a laptop, a tablet, a personal computers (PC), a work station, or a video game device.

8. The SU of claim 1, wherein the DSN includes at least one of a wireless communication system, a wire lined communication system, a non-public intranet system, a public internet system, a local area network (LAN), or a wide area network (WAN).

9. A storage unit (SU) comprising:

an interface configured to interface and communicate with a dispersed or distributed storage network (DSN);

memory that stores operational instructions; and a processing module operably coupled to the interface and to the memory, wherein the processing module, when operable within the SU based on the operational instructions, is configured to:

store, based on a first write command that is received via the DSN and via the interface from a computing device, at least one encoded data slice (EDS) of a first set of encoded data slices (EDSs) corresponding to a data object that are distributedly stored in a first plurality of SUs that includes the SU within the DSN, wherein the data object is segmented into a first plurality of data segments, wherein a data segment of the first plurality of data segments is dispersed error encoded in accordance with dispersed error encoding parameters to produce the first set of EDSs;

store, based on a second write command that is received via the DSN and via the interface from the computing device or another computing device, an intent message that includes specifications for consistency between the data object and metadata of the data object, wherein a second set of EDSs corresponding to the metadata of the data object are distributedly stored in a second plurality of SUs within the DSN, wherein the metadata is segmented into a second plurality of data segments, wherein a data segment of the second plurality of data segments is dispersed error encoded in accordance with the dispersed error encoding parameters or other dispersed error encoding parameters to produce the second set of EDSs;

determine a time at or during which to service the intent message;

service the intent message at or during the time to determine whether the data object and the metadata of the data object are consistent based on the specifications including to determine that the data object and the metadata of the data object are inconsistent based on the specifications when a commit phase or a finalize phase of a 3 phase write process that includes a write phase, the commit phase, and the finalize phase for storage of the first set of EDSs corresponding to the data object within the first plurality of SUs that includes the SU within the DSN or the second set of EDSs corresponding to the metadata of the data object within the second plurality of SUs within the DSN is determined to have failed;

when the data object and the metadata of the data object are determined to be consistent based on the service the intent message, delete the intent message that is stored in the SU; and when the data object and the metadata of the data object are determined to be inconsistent based on the service the intent message, eliminate inconsistency between the data object and the metadata of the data object within the DSN.

10. The SU of claim 9, wherein the processing module, when operable within the SU based on the operational instructions, is further configured to:

determine a time at or during which to service the intent message; and eliminate the inconsistency between the data object and the metadata of the data object by:

transmitting a delete command via the DSN for at least one of the first set of EDSs corresponding to the data object that are distributedly stored in the first plurality of SUs or the second set of EDSs corresponding to the metadata of the data object that are distributedly stored in the second plurality of SUs;

transmitting a first repair command via the DSN to repair the first set of EDSs corresponding to the data object that are distributedly stored in the first plurality of SUs to be consistent with the second set of EDSs corresponding to the metadata of the data object that are distributedly stored in the second plurality of SUs; or transmitting a second repair command via the DSN to repair the second set of EDSs corresponding to the metadata of the data object that are distributedly stored in the second plurality of SUs to be consistent with the first set of EDSs corresponding to the data object that are distributedly stored in the first plurality of SUs.

11. The SU of claim 9, wherein the processing module, when operable within the SU based on the operational instructions, is further configured to:

determine, when servicing the intent message to determine whether the data object and the metadata of the data object are consistent based on the specifications, that the data object and the metadata of the data object are consistent when a first version of the at least one EDS of the first set of EDSs corresponding to the data object compares favorably with a second version of the second set of EDSs corresponding to the metadata of the data object; or determine, when servicing the intent message to determine whether the data object and the metadata of the data object are consistent based on the specifications, that the data object and the metadata of the data object are consistent when a first system configuration of a Decentralized, or Distributed, Agreement Protocol (DAP) of the DSN that corresponds to storage of the at least one EDS of the first set of EDSs corresponding to the data object compares favorably with a second system configuration of the DAP of the DSN that corresponds to storage of the second set of EDSs corresponding to the metadata of the data object.

12. The SU of claim 9, wherein the computing device includes another SU of the first plurality of SUs, an SU of the second plurality of SUs within the DSN, a wireless smart phone, a laptop, a tablet, a personal computers (PC), a work station, or a video game device.

13. The SU of claim 9, wherein the DSN includes at least one of a wireless communication system, a wire lined communication system, a non-public intranet system, a public internet system, a local area network (LAN), or a wide area network (WAN).

14. A method for execution by a storage unit (SU), the method comprising:

storing, based on a first write command from a computing device that is received via an interface of the SU that is configured to interface and communicate with a dispersed or distributed storage network (DSN), at least one encoded data slice (EDS) of a first set of encoded data slices (EDSs) corresponding to a data object that are distributedly stored in a first plurality of SUs that includes the SU within the DSN, wherein the data object is segmented into a first plurality of data segments, wherein a data segment of the first plurality of data segments is dispersed error encoded in accordance with dispersed error encoding parameters to produce the first set of EDSs;

storing, based on a second write command from the computing device or another computing device that is received via the interface of the SU, an intent message that includes specifications for consistency between the data object and metadata of the data object, wherein a second set of EDSs corresponding to the metadata of the data object are distributedly stored in a second plurality of SUs within the DSN, wherein the metadata is segmented into a second plurality of data segments, wherein a data segment of the second plurality of data segments is dispersed error encoded in accordance with the dispersed error encoding parameters or other dispersed error encoding parameters to produce the second set of EDSs;

servicing the intent message to determine whether the data object and the metadata of the data object are consistent based on the specifications;

when the data object and the metadata of the data object are determined to be consistent based on the service the intent message, deleting the intent message that is stored in the SU; and when the data object and the metadata of the data object are determined to be inconsistent based on the service the intent message, eliminating inconsistency between the data object and the metadata of the data object within the DSN.

15. The method of claim 14 further comprising:

determining a time at or during which to service the intent message; and eliminating the inconsistency between the data object and the metadata of the data object by:

transmitting, via the interface of the SU and via the DSN, a delete command for at least one of the first set of EDSs corresponding to the data object that are distributedly stored in the first plurality of SUs or the second set of EDSs corresponding to the metadata of the data object that are distributedly stored in the second plurality of SUs;

transmitting, via the interface of the SU and via the DSN, a first repair command to repair the first set of EDSs corresponding to the data object that are distributedly stored in the first plurality of SUs to be consistent with the second set of EDSs corresponding to the metadata of the data object that are distributedly stored in the second plurality of SUs; or transmitting, via the interface of the SU and via the DSN, a second repair command to repair the second set of EDSs corresponding to the metadata of the data object that are distributedly stored in the second plurality of SUs to be consistent with the first set of EDSs corresponding to the data object that are distributedly stored in the first plurality of SUs.

16. The method of claim 14, when the data object and the metadata of the data object are determined to be inconsistent based on the service the intent message, further comprising:

transmitting, via the interface of the SU and via the DSN, a notification of inconsistency between the data object and the metadata of the data object to the computing device, wherein the computing device is associated with a user;

receiving, via the interface of the SU and via the DSN, an instruction message from the computing device associated with the user that specifies an operation to be performed by the SU to eliminate the inconsistency between the data object and the metadata of the data object; and performing the operation specified in the instruction message to eliminate the inconsistency between the data object and the metadata of the data object.

17. The method of claim 14 further comprising:
determining the data object and the metadata of the data object are inconsistent based on the specifications when a commit phase or a finalize phase of a 3 phase write process that includes a write phase, the commit phase, and the finalize phase for storage of the first set of EDSs corresponding to the data object within the first plurality of SUs that includes the SU within the DSN or the second set of EDSs corresponding to the metadata of the data object within the second plurality of SUs within the DSN is determined to have failed.

18. The method of claim 14 further comprising:
determining, when servicing the intent message to determine whether the data object and the metadata of the data object are consistent based on the specifications, that the data object and the metadata of the data object are consistent when a first version of the at least one EDS of the first set of EDSs corresponding to the data object compares favorably with a second version of the second set of EDSs corresponding to the metadata of the data object; or
determining, when servicing the intent message to determine whether the data object and the metadata of the data object are consistent based on the specifications, that the data object and the metadata of the data object are consistent when a first system configuration of a Decentralized, or Distributed, Agreement Protocol (DAP) of the DSN that corresponds to storage of the at least one EDS of the first set of EDSs corresponding to the data object compares favorably with a second system configuration of the DAP of the DSN that corresponds to storage of the second set of EDSs corresponding to the metadata of the data object.

19. The method of claim 14, wherein:
the SU is located at a first premises that is remotely located from at least one SU of at least one SU of the first plurality of SUs or the second plurality of SUs within the DSN; and the computing device includes another SU of the first plurality of SUs, an SU of the second plurality of SUs within the DSN, a wireless smart phone, a laptop, a tablet, a personal computers (PC), a work station, or a video game device.

20. The method of claim 14, wherein the DSN includes at least one of a wireless communication system, a wire lined communication system, a non-public intranet system, a public internet system, a local area network (LAN), or a wide area network (WAN).

* * * * *